United States Patent
Yu et al.

(10) Patent No.: US 8,837,248 B2
(45) Date of Patent: Sep. 16, 2014

(54) NON-VOLATILE MEMORY STORAGE APPARATUS, MEMORY CONTROLLER AND DATA STORING METHOD

(71) Applicant: Phison Electronics Corp., Miaoli (TW)

(72) Inventors: Hsiang-Hsiung Yu, Xinbei (TW);
Ta-Chuan Wei, Miaoli County (TW);
Yun-Chieh Chen, Miaoli County (TW);
Yu-Chung Shen, Kaohsiung County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/772,363

(22) Filed: Feb. 21, 2013

(65) Prior Publication Data

US 2013/0159641 A1 Jun. 20, 2013

Related U.S. Application Data

(62) Division of application No. 13/026,312, filed on Feb. 14, 2011, now Pat. No. 8,416,621.

(30) Foreign Application Priority Data

Oct. 8, 2010 (TW) .............................. 99134406 A

(51) Int. Cl.
| | |
|---|---|
| *G11C 16/10* | (2006.01) |
| *G06F 12/02* | (2006.01) |
| *G06F 3/06* | (2006.01) |
| *G11C 5/14* | (2006.01) |
| *G11C 16/30* | (2006.01) |
| *G06F 12/00* | (2006.01) |

(52) U.S. Cl.
CPC ............ *G06F 12/00* (2013.01); *G06F 12/0246* (2013.01); *G06F 3/0656* (2013.01); *G11C 5/143* (2013.01); *G06F 3/0614* (2013.01); *G06F 3/0658* (2013.01); *G11C 16/30* (2013.01); *G06F 3/0679* (2013.01); *G11C 16/10* (2013.01); *G06F 2212/7203* (2013.01)
USPC .......................... 365/226; 365/228; 365/210.1

(58) Field of Classification Search
CPC ........ G11C 5/141; G11C 14/00; G11C 5/143; G11C 5/147; H03K 3/356008
USPC ........................................ 365/226, 228, 210.1
See application file for complete search history.

(56) References Cited

U.S. PATENT DOCUMENTS

| | | | |
|---|---|---|---|
| 2003/0210601 A1* | 11/2003 | Lin et al. ........................ | 365/229 |
| 2009/0006719 A1 | 1/2009 | Traister | |

FOREIGN PATENT DOCUMENTS

| | | |
|---|---|---|
| CN | 101552032 | 10/2009 |
| CN | 101866320 | 10/2010 |

OTHER PUBLICATIONS

"First Office Action of China Counterpart Application", issued on Dec. 6, 2013, p. 1-p. 8, in which the listed reference was cited.
"Office Action of Taiwan Counterpart Application", issued on Feb. 21, 2014, p. 1-p. 6, in which the listed reference was cited.
"Office Action of China Counterpart Application", issued on Jun. 20, 2014, pp. 1-8, in which the listed reference was cited.

* cited by examiner

*Primary Examiner* — Jason Lappas
(74) *Attorney, Agent, or Firm* — Jianq Chyun IP Office

(57) ABSTRACT

A non-volatile memory storage apparatus having a connector, an energy storage circuit, a power regulator and supply circuit, a non-volatile memory module, a memory controller and a buffer memory is provided. The power regulator and supply circuit is configured for transforming an output voltage from the energy storage circuit into a first voltage used for the non-volatile memory module and a second voltage used for the memory controller and the buffer memory. The memory controller is configured for writing data stored temporarily in the buffer memory into the non-volatile memory module with a special writing mode when receiving a detecting signal indicating that an input voltage is continuously smaller than a predetermined voltage for a predetermined period or receiving a detecting signal indicating that an inactive status of the connector or receiving a suspend mode signal, a warm reset signal or a hot reset signal from a host system.

10 Claims, 10 Drawing Sheets

NON-VOLATILE MEMORY STORAGE APPARATUS, MEMORY CONTROLLER AND DATA STORING METHOD

CROSS-REFERENCE TO RELATED APPLICATION

This application is a divisional of and claims the priority benefit of U.S. application Ser. No. 13/026,312 filed on Feb. 14, 2011, now allowed, which claims the priority benefit of Taiwan application serial no. 99134406, filed on Oct. 8, 2010. The entirety of each of the above-mentioned patent applications is hereby incorporated by reference herein and made a part of specification.

BACKGROUND

1. Technology Field

The present invention relates to a non-volatile memory storage apparatus, a memory controller and a data storing method, which are capable of writing data stored temporarily in a buffer memory into a non-volatile memory module of the non-volatile memory storage apparatus when the power supply of the non-volatile memory storage apparatus is disconnected unexpectedly.

2. Description of Related Art

The markets of digital cameras, cellular phones, and MP3 players have expanded rapidly in recent years, so that consumer demand for storage media have also rapid increased. Rewritable non-volatile memory is one of the most adaptable memories for battery-powered portable products due to its characteristics such as data non-volatility, low power consumption, small volume, and non-mechanical structure. A flash drive is a storage apparatus adopting NAND flash memory as storage medium. For example, through a universal serial bus (USB), users can easily plug a flash drive into a host to deliver digital data.

Because the speed of writing data into a flash memory module is far lower than the transmission speed of the USB coupled to a host, in general, a buffer memory may be disposed in the non-volatile memory storage apparatus for temporarily storing data from the host. In particular, when the host gives a write command and data to be written to the non-volatile memory storage apparatus, a memory control circuit (also referred to as a memory controller) replies a message indicating that the write command has completed to the host after temporarily storing the data in the buffer memory, thereby enhancing the performance of the non-volatile memory storage apparatus.

However, the flash drive has to operate with a power supplied by the host through the USB. Therefore, if data is stored temporarily in the buffer memory and a user removes the flash drive from the host, the data will be lost. Thereby, when the power supply of the non-volatile memory storage apparatus is disconnected unexpectedly, how to reserve data stored in the buffer memory is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a non-volatile memory storage apparatus, a memory controller and a data storing method, which are capable of writing data stored in a buffer memory into a non-volatile memory module of the non-volatile memory storage apparatus when the power supply of the non-volatile memory storage apparatus is disconnected unexpectedly.

According to an exemplary embodiment of the present invention, a non-volatile memory storage system including a connector, an energy storage circuit, a power regulator and supply circuit, a non-volatile memory module, a memory controller and a buffer memory is provided. The connector is configured to couple to a host system. The energy storage circuit is configured to receive an input voltage and provide an output voltage. The power regulator and supply circuit is coupled to the energy circuit and is configured to transform the output voltage into a first voltage and a second voltage. The non-volatile memory module is coupled to the power regulator and supply circuit and is operated with a first voltage. The memory controller is coupled to the connector, the energy storage circuit and the power regulator and supply circuit and is operated with the second voltage. The buffer memory is configured for storing data temporarily. The memory controller is configured to write the data stored temporarily in the buffer memory into the non-volatile memory module when receiving a signal, wherein the signal is a detection signal, which indicates that the input voltage is smaller continuously than a predetermined voltage for a predetermined period, a detection signal, which indicates that an inactive status of the connector, or a suspend mode signal, a warm reset signal or a hot-reset signal from the host system.

According to an exemplary embodiment of the present invention, a memory controller including a host interface, a memory interface, a memory management circuit and a buffer memory is provided. The host interface is configured to couple to a host system. The memory interface is configured to couple to a non-volatile memory module. The memory management circuit is coupled to the host interface and the memory interface. The buffer memory is coupled to the memory management circuit and configured for temporarily storing data from the host system. The memory management circuit is configured to write the data stored temporarily in the buffer memory into the non-volatile memory module when receiving a signal. Additionally, the memory management circuit is configured to turn on a switch disposed in the energy circuit.

According to an exemplary embodiment of the present invention, a data storing method for a non-volatile memory module is provided. The data storing method includes determining whether an input voltage from a host system is smaller continuously than a predetermined voltage for a predetermined period. The data storing further includes writing data stored temporarily in a buffer memory into the non-volatile memory module when the input voltage from the host system is smaller continuously than the predetermined voltage for the predetermined period.

According to an exemplary embodiment of the present invention, a data storing method for a non-volatile memory module is provided. The data storing method includes determining whether an inactive status of a connector is detected. The data storing further includes writing data stored temporarily in a buffer memory into the non-volatile memory module when the inactive status of the connector is detected.

According to an exemplary embodiment of the present invention, a data storing method for a non-volatile memory module is provided. The data storing method includes determining whether a suspend mode signal, a warm reset signal or hot-reset signal is received from the host system. The data storing further includes writing data stored temporarily in a buffer memory into the non-volatile memory module when the suspend mode signal, the warm reset signal or the hot-reset signal is received from the host system.

Based on the above, the non-volatile memory storage apparatus, the memory controller and the data storing method according to the present exemplary embodiments are capable of writing data stored in a buffer memory into a non-volatile memory module of the non-volatile memory storage apparatus when the power supply of the non-volatile memory storage apparatus is disconnected.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
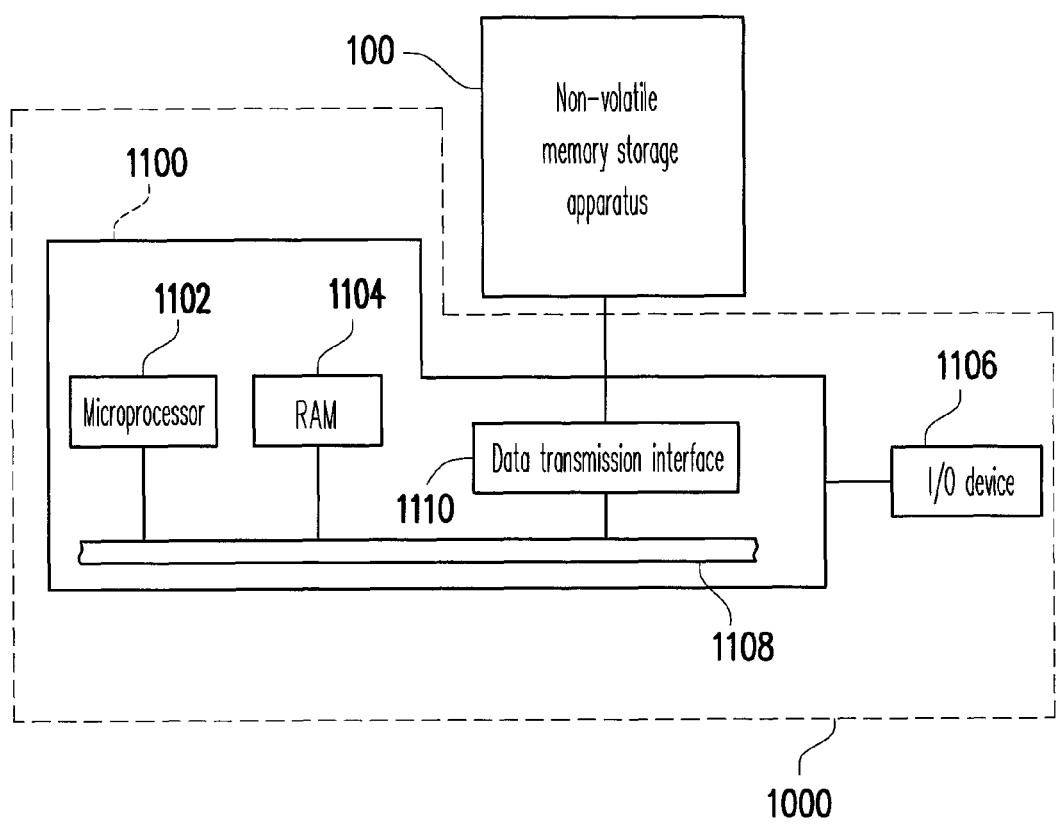
FIG. 1A illustrates a host system and a non-volatile memory storage apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A non-volatile memory storage apparatus (i.e., a non-volatile memory storage system), typically, includes a non-volatile memory module and a memory controller (i.e., a memory control circuit). The non-volatile memory storage apparatus is usually used together with a host system so that the host system can write data into or read data from the non-volatile memory storage apparatus.

FIG. 1A illustrates a host system and a non-volatile memory storage apparatus according to an exemplary embodiment of the present invention.

Figure 1B:
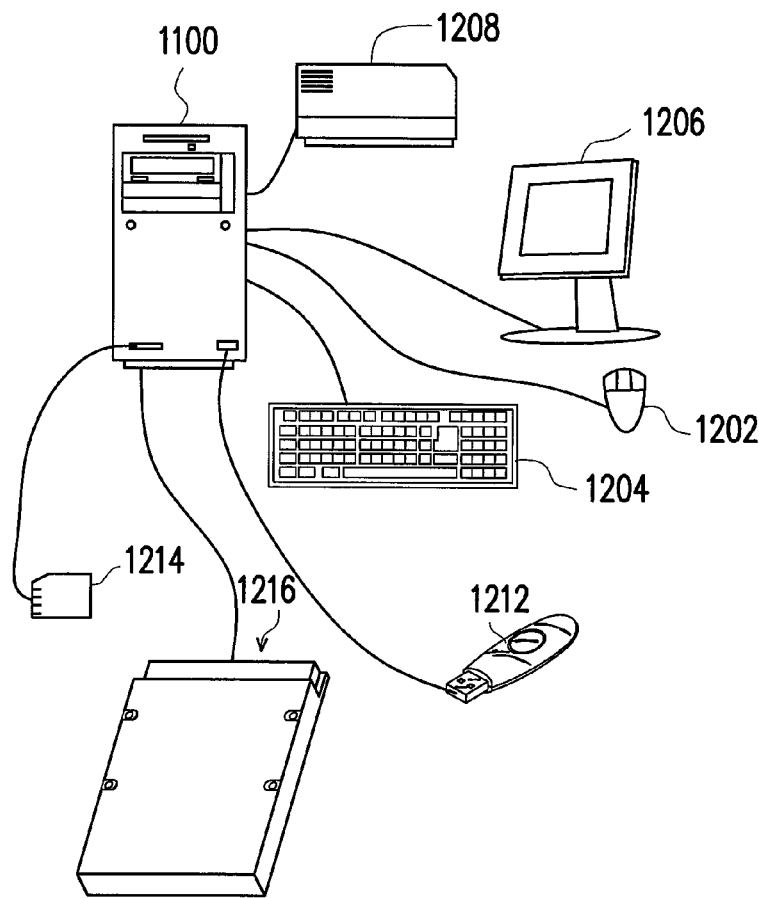
FIG. 1B is a schematic diagram showing a computer, an input/output device, and a non-volatile memory storage apparatus according to an embodiment of the invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. It should be noted that the devices in FIG. 1B do not limit the I/O device 1106, which may further include other devices.

In the exemplary embodiment of the present invention, the non-volatile memory storage apparatus 100 is coupled to other devices of the host system 1000 through the data transmission interface 1110. Through operations of the microprocessor 1102, the random access memory (RAM) 1104, and the Input/Output (I/O) device 1106, data can be written into or read from the non-volatile memory storage apparatus 100. For example, the non-volatile memory storage apparatus 100 may be a flash drive 1212, a memory card 1214, or a solid state drive (SSD) 1216 shown in FIG. 1B.

Figure 1C:
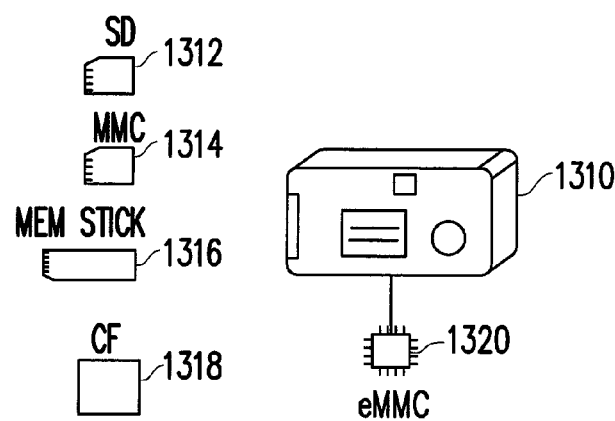
FIG. 1C is a schematic diagram showing a host system and a non-volatile memory storage apparatus according to another embodiment of the invention.

Generally, the host system 1000 substantially could be any system capable of storing data. Even though the host system 1000 is described as a computer system in the present exemplary embodiment, in another exemplary embodiment of the present invention, the host system 1000 may also be a digital camera, a video camera, a communication device, an audio player, or a video player, etc. For example, if the host system is a digital camera (video camera) 1310, the non-volatile memory storage apparatus is then a SD card 1312, a MMC card 1314, a memory stick 1316, a CF card 1318 or an embedded storage device 1320 (as shown in FIG. 1C). The embedded storage device 1320 includes an embedded MMC (eMMC). It should be noted that the eMMC is directly coupled to the substrate of the host system.

Figure 2:
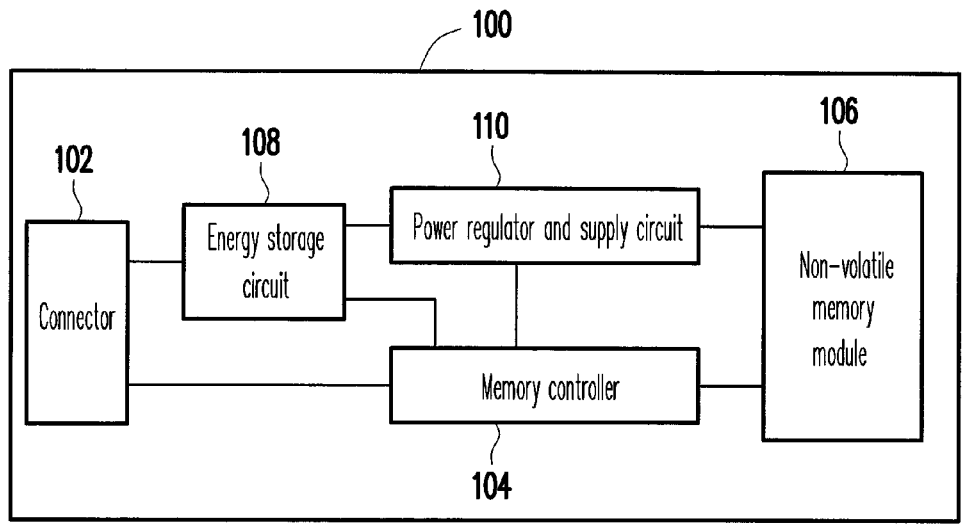
FIG. 2 is a schematic block diagram showing the non-volatile memory storage apparatus shown in FIG. 1A.

FIG. 2 is a schematic block diagram showing the non-volatile memory storage apparatus shown in FIG. 1A.

Referring to FIG. 2, the non-volatile memory storage apparatus 100 includes a connector 102, a memory controller 104, a non-volatile memory module 106, an energy storage circuit 108 and a power regulator and supply circuit 110.

The connector 102 is coupled to the memory controller 104 and is configured for coupling to the host system 1000. That is, the non-volatile memory storage apparatus 100 is connected to a corresponding port of the host system 1000 through the connector 102.

In the present exemplary embodiment, the connector 102 is a universal serial bus (USB) connector. However, it should be noticed that the present invention is not limited thereto and the connector 102 also can be an institute-of-electrical-and-electronic-engineers (IEEE) 1394 connector, a peripheral-component Interconnect-express (PCI Express) connector, a serial advanced technology attachment (SATA) connector, a secure digital (SD) interface connector, a memory stick (MS) interface connector, a multi-media-card (MMC) interface connector, a compact flash (CF) interface connector, an integrated-device-electronics (IDE) connector or other suitable type of connectors.

The memory controller 104 executes a plurality of logic gates or control instructions implemented in a hardware form or a firmware form and performs various data operations, such as data writing, reading, and erasing, in the non-volatile memory module 106 according to commands of the host system 1000. In particular, the memory controller 104 is configured for executing a data storing method and a memory management method according to the present exemplary embodiment to perform data writing, data reading, data erasing, block management and so on. The data storing method and the memory management method according to the present exemplary embodiment will be described with drawings in the following.

The non-volatile memory module 106 is coupled to the memory controller 104 and configured for temporarily storing data written by the host system 1000. The non-volatile memory module 106 includes a plurality of physical blocks. Each of the physical blocks has a plurality of physical pages, wherein the physical pages belonging to the same physical block can be written individually and must be erased simultaneously. In detail, the smallest unit for erasing data is one physical block. That is, each physical block contains the least number of memory cells that are erased together. In addition, the smallest unit for programming is one physical page. That is, one physical page is the smallest unit for writing data. Each physical page usually includes a data bit area and a redundant bit area. The data bit area is used for storing user data, and the redundant bit area is used for storing system data (for example, the ECC code). The configuration of the data bit area and the redundant bit area is well known by people skilled in the art and the details are not described herein. According to the present embodiment, the non-volatile memory module 106 is a multi level cell (MLC) NAND flash memory module. However, the present invention is not limited thereto, and the non-volatile memory module 106 may also be a single level cell (SLC) NAND flash memory module, other flash memory module or other memory module having the same characteristic.

The energy storage circuit 108 is coupled to the memory controller 104. In the present exemplary embodiment, the power needed for the operation of the non-volatile memory storage apparatus 100 is supplied by the host system 1000 through the connector 102. Herein, the energy storage circuit 108 is configured for receiving an input voltage from the host system 1000 through the connector 102 and providing an output voltage. In particular, in the present exemplary embodiment, the energy storage circuit 108 is further configured for storing a spare electric energy. And, when the host system 1000 stops to supply the power to the non-volatile memory apparatus 100, the energy storage circuit 108 may provide the spare electric energy as the output voltage, thereby keeping temporarily the operations of the memory controller 104 and the non-volatile memory module 106.

The power regulator and supply circuit 110 is coupled to the energy storage circuit 108 and configured for controlling the power of the non-volatile memory storage apparatus 100. To be specific, the power regulator and supply circuit 110 transforms the received voltage (i.e., the output voltage provided by the energy storage circuit 108) into a first voltage and a second voltage, provides the first voltage to the non-volatile memory module 106 and provides the second voltage to the memory controller 104.

Figure 3:
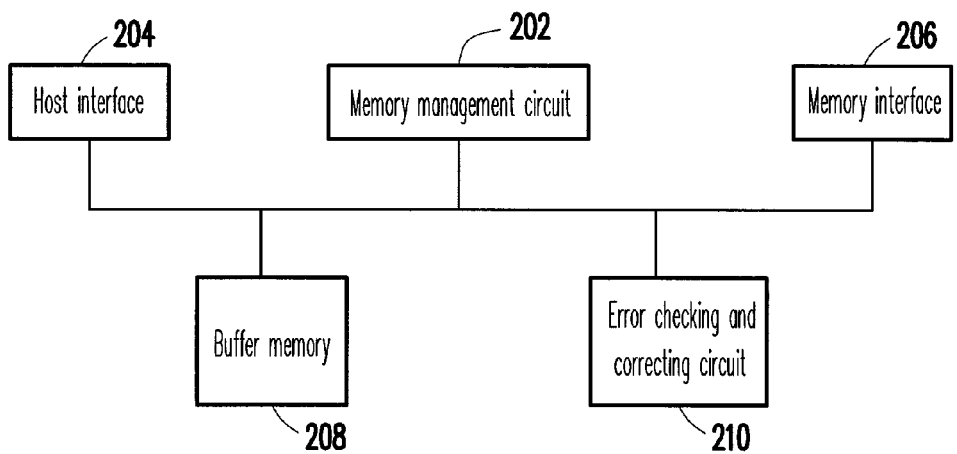
FIG. 3 is a schematic block diagram of a memory controller according to an exemplary embodiment of the present invention.

FIG. 3 is a schematic block diagram of a memory controller according to an exemplary embodiment of the present invention.

Referring FIG. 3, the memory controller 104 includes a memory management circuit 202, a host interface 204, a memory interface 206 and a buffer memory 208.

The memory management circuit 202 is configured for controlling the whole operation of the memory controller 104. For example, the memory management circuit 202 has a plurality of control instructions, and the control instructions are executed to perform the data storing method and the memory management method of the present exemplary embodiment when the non-volatile memory storage apparatus 100 is operated.

For example, in the present exemplary embodiment, the control instructions of the memory management circuit 202 are implemented in a firmware form. For example, the memory management circuit 202 has a micro-processor unit (not shown) and a read-only memory (not shown), and these control instructions are burned in the read-only memory. When the non-volatile memory storage apparatus 100 is operated, the control instructions are executed by the micro-processor unit to accomplish the data storing method and the memory management method according to the present exemplary embodiment.

In another exemplary embodiment of the invention, the control instructions of the memory management circuit 202 are stored in a specific area (for example, the system area of the memory module exclusively used for storing system data) of the non-volatile memory module 106 as program codes. Additionally, the memory management circuit 202 may have a micro-processor unit (not shown), a read-only memory (not shown), and a random access memory (not shown). In particular, the read-only memory has a driver code, and when the memory controller 104 is enabled, the micro-processor unit executes the driver code to load the control instructions of the memory management circuit 202 stored in the non-volatile memory module 106 into the random access memory of the memory management circuit 202. Then, the micro-processor unit runs these control instructions to accomplish the data storing method and the memory management method of the present exemplary embodiment. Additionally, in another exemplary embodiment of the present invention, the control instructions of the memory management circuit 202 may also be implemented in a hardware form.

The host interface 204 is coupled to the memory management circuit 202, and configured for receiving and identifying commands and data from the host system 1000. In other words, the commands and data from the host system 1000 are transmitted to the memory management circuit 202 through the host interface 204. In the present exemplary embodiment, the host interface 204 is a USB interface corresponding to the connector 102. However, it should be understood that the invention is not limited thereto, and the host interface 204 may be a PATA interface, an IEEE 1394 interface, a PCI express interface, a SD interface, a MS interface, a MMC interface, a CF interface, a SATA interface, an IDE interface, or other suitable data transmission interfaces.

The memory interface 206 is coupled to the memory management circuit 202 and configured for accessing the non-volatile memory module 106. Namely, data to be written into the non-volatile memory module 106 is converted by the memory interface 206 into a format acceptable to the non-volatile memory module 106.

The buffer memory 208 is coupled to the memory management circuit 202 and configured to temporarily store data and commands from the host system 1000 or data from the non-volatile memory module 106. In the present embodiment, the buffer memory 208 is a static random access memory (SRAM). However, it should be understood that the invention is not limited thereto, and in another exemplar embodiment, the host memory 208 may be a dynamic random access memory (DRAM) or other memory. Additionally, in another exemplary embodiment, the buffer memory 208 may be disposed independently. That is, the buffer memory 208 may be disposed out of the memory controller 104 and coupled to the memory controller 104 through the memory controller 104.

In another exemplary embodiment of the present invention, the memory controller 104 still includes an error checking and correcting circuit 210. The error checking and correcting circuit 210 is coupled to the memory management circuit 202, and configured for executing an error checking and correcting procedure to ensure data accuracy. For example, when the memory management circuit 202 receives a write command from the host system 1000, the error checking and correcting circuit 210 generates an error checking and correcting (ECC) code for data corresponding to the write command, and the memory management circuit 202 writes the data and the corresponding ECC code into the non-volatile memory module 106. Subsequently, when the memory management circuit 202 reads the data from the non-volatile memory module 106, the memory management circuit 202 simultaneously reads the corresponding ECC code, and the error checking and correcting circuit 210 executes the ECC procedure for the read data based on the corresponding ECC code.

Figure 4:
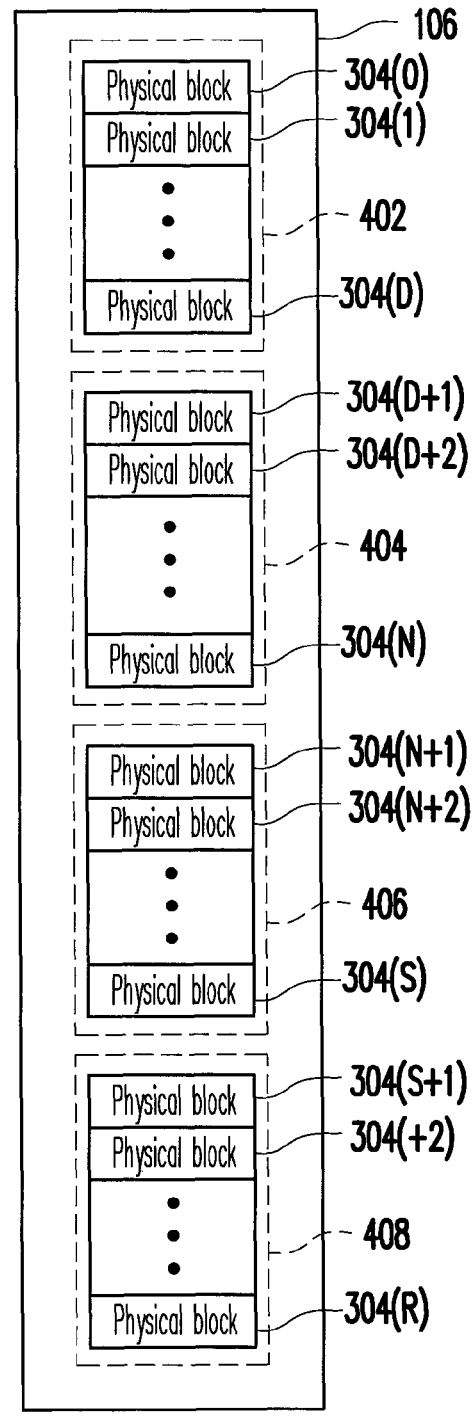
FIG. 4 and FIG. 5 are diagrams of managing the non-volatile memory module according to an exemplary embodiment of the present invention.
Figure 5:
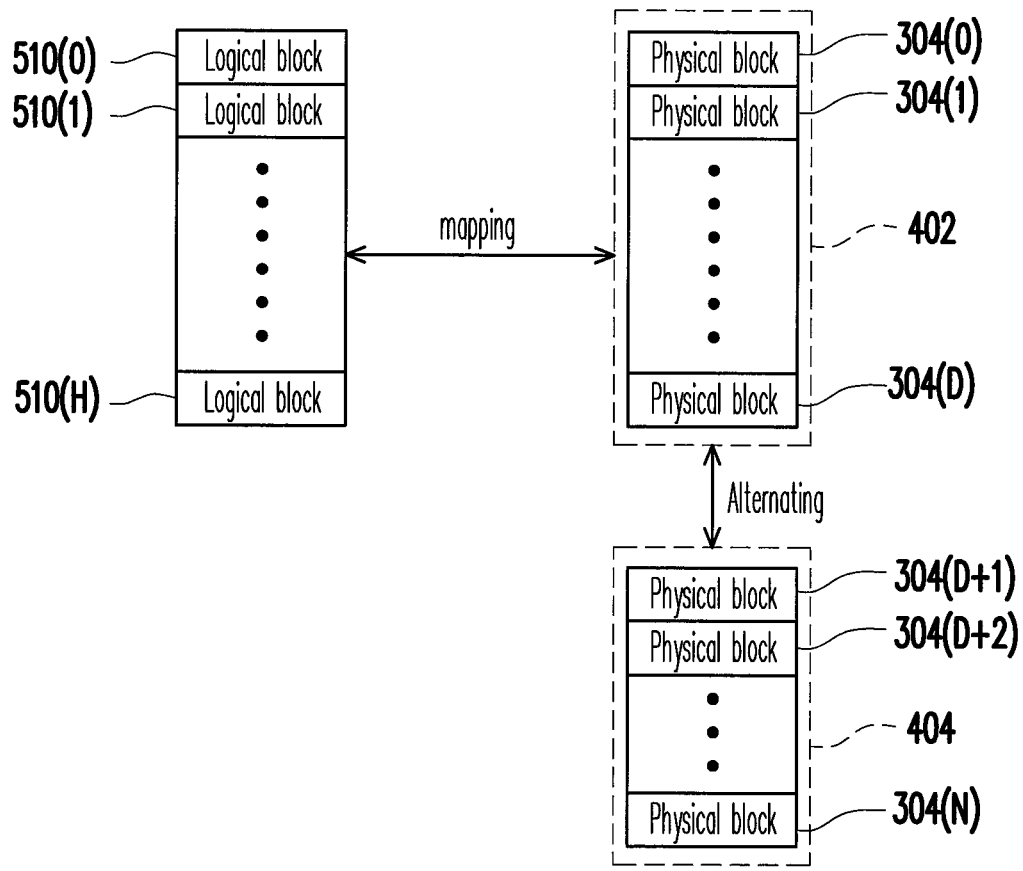

FIG. 4 and FIG. 5 are diagrams of managing the non-volatile memory module according to an exemplary embodiment of the present invention.

It should be understood that the terms used herein for describing the operations (for example, "get", "select", "replace", "group", and "alternate", etc) performed on the physical blocks of the non-volatile memory module 106 refer to logical operations performed on these physical blocks. Namely, the physical blocks in the non-volatile memory module 106 are only logically operated and the actual positions thereof are not changed.

Referring to FIG. 4, the memory management circuit 202 logically groups the physical blocks 304(0)~304(R) of the non-volatile memory module 106 into a data area 402, a spare area 404, a system area 406 and a replacement area 408.

The physical blocks of the data area 402 and the spare area 404 are used for storing data written by the host system 1000. To be specific, the physical blocks of the data area 402 are physical blocks which have been used for storing data, and the physical blocks of the spare area 404 are physical blocks which are used for substituting the physical blocks of the data area 402. Hence, the physical blocks of the spare area 404 are either blank or available blocks (i.e., no data is recorded in these blocks or data recorded in these blocks is marked as invalid data). That is, the physical blocks of the spare area 404 have been operated by an erasing operation, or when a physical block of the spare area 404 is gotten for storing data, the gotten physical block needs to be operated by the erasing operation first. Hence, the physical blocks of the spare area 404 are available physical blocks.

The physical blocks logically belonging to the system area 406 are used for recording system data, which includes information related to the manufacturer and a model of the non-volatile memory module, the number of the physical blocks in the non-volatile memory module, the number of the physical pages in each physical block, and so forth.

The physical blocks logically belonging to the replacement area 408 are replacement physical blocks. For example, when the non-volatile memory module 106 is manufactured in the factory, 4% of the physical blocks thereof are reserved for replacement. Namely, when any physical block in the data area 402, the spare area 404, and the system area 406 is damaged, a physical block in the replacement area 408 is used for replacing the damaged physical block (i.e., the bad block). Thus, if there are still normal physical blocks in the replacement area 408 and a physical block is damaged, the memory management circuit 202 gets a normal physical block from the replacement area 408 for replacing the damaged physical block. If there is no more normal physical block in the replacement area 408 and a physical block is damaged, the non-volatile memory storage apparatus 100 is announced as being in a write-protect status and cannot be used for writing data anymore.

In particular, the numbers of physical blocks in the data area 402, the spare area 404, the system area 406 and the replacement area 408 are various based on different memory module standards. Additionally, it has to be understood that the grouping relationships of grouping the physical blocks into the data area 402, the spare area 404, the system area 406 and the replacement area 408 are dynamically changed during the operation of the non-volatile memory storage apparatus 100. For example, when a physical block of the spare area 404 is damaged and replaced by a physical block of the replacement area 408, the physical block of the replacement area 408 is associated with the spare area 404.

Referring to FIG. 5, as described above, the physical blocks of the data area 402 and the spare area 404 are alternated to store data written by the host system 1000. In the present exemplary embodiment, the memory management circuit 202 configures logical addresses for the host system 1000 to properly access data in the physical blocks that store data with the above-mentioned alternate manner In particular, the memory management circuit 202 groups the logical addresses into logical blocks 510(0)~510(H) and maps the logical blocks 510(0)~510(H) to the physical blocks of the data area 402. For example, when the non-volatile memory storage apparatus 100 is formatted by the operation system of the host system 1000 with a file system (e.g., FAT 32), the logical blocks 510(0)~510(H) map to the physical blocks 304(0)~304(D) of the data area 402, respectively. That is, one logical block maps to one physical block in the data area 402. Herein, the memory management circuit 202 establishes a logical block-physical block mapping table for recoding mapping relationships between the logical blocks and the physical blocks.

Figure 6:
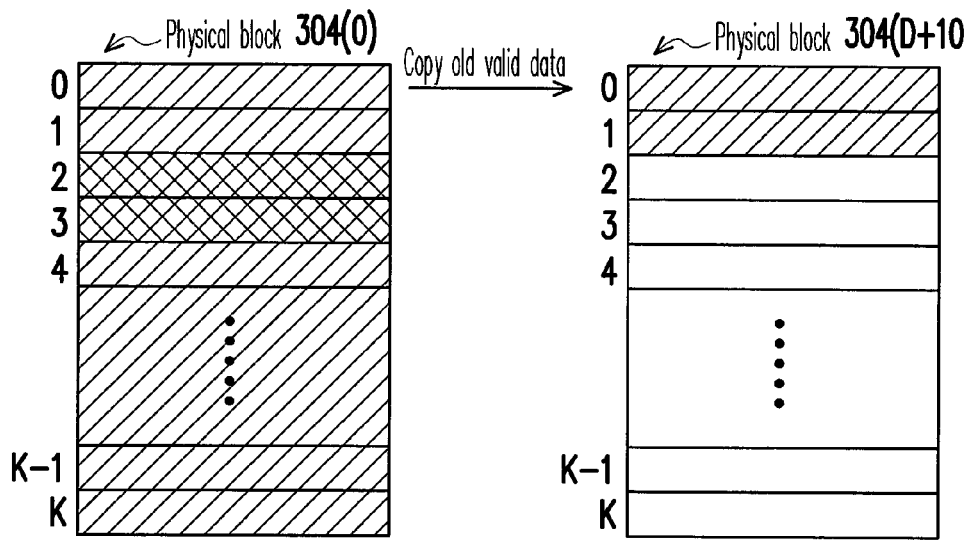
FIGS. 6~8 are diagrams illustrating an example of writing data into the non-volatile memory module according to an exemplary embodiment of the present invention.
Figure 7:
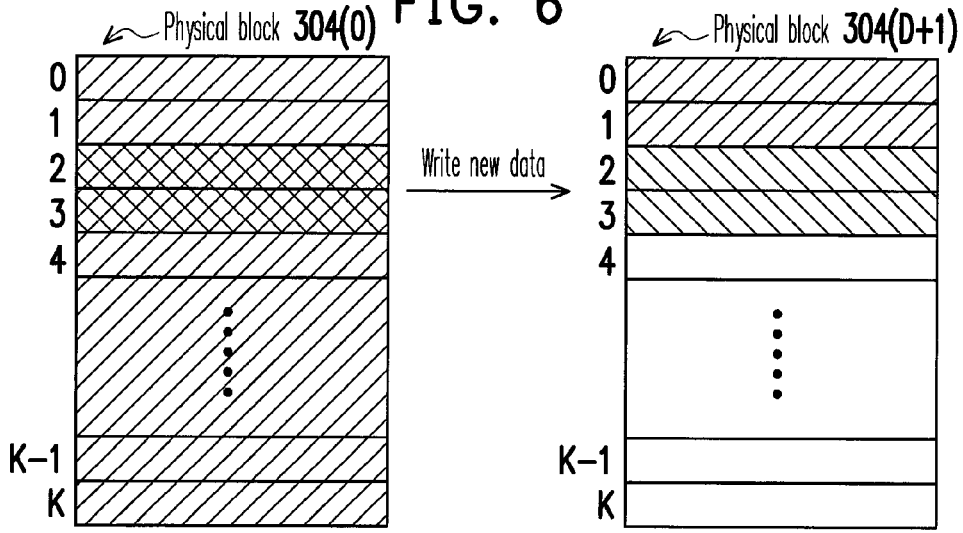
Figure 8:
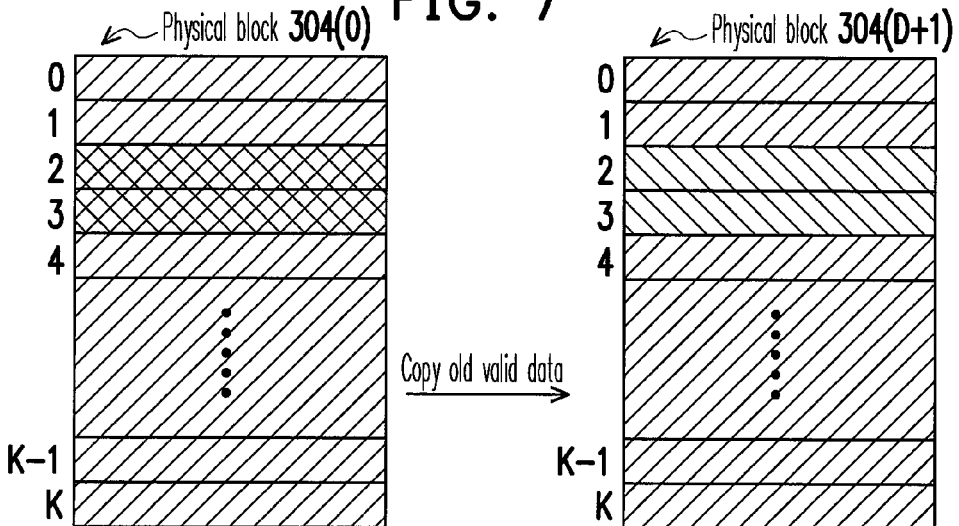

FIGS. 6~8 are diagrams illustrating an example of writing data into the non-volatile memory module according to an exemplary embodiment of the present invention.

Referring to FIGS. 6~8, for example, when the logical block 510(0) currently maps to the physical block 304(0) and the memory controller 104 receives a write command from the host system 1000 for writing data into the logical addresses belonging to the logical block 510(0), the memory management circuit 202 identifies that the logical unit 510(0) currently maps to the physical block 304(0) based on the logical block-physical block mapping table and gets the physical block 304(D+1) from the spare area 404 as a substitute physical block for substituting the physical block 304(0). However, the memory management circuit 202 does not instantly move all the valid data in the physical block 304(0) into the physical block 304(D+1) and erase the physical block 304(0) when executing the write command To be specific, the memory management circuit 202 copies the valid data before the physical page for writing the new data in the physical block 304(0) (i.e., the $0^{th}$ physical page and the $1^{st}$ physical page of the physical block 304(0)) to the $0^{th}$ physical page and the $1^{st}$ physical page of the physical block 304 (D+1) (as shown in FIG. 6) and writes the new data into the $2^{nd}$ physical page and the $3^{rd}$ physical page of the physical block 304(D+1) (as shown in FIG. 7). At this time, the memory management circuit 202 completes the writing operation (i.e., the write command has been finished). Because the valid data in the physical block 304 (0) may become invalid during a next operation (for example, next write command), instantly moving all the valid data in the physical block 304(0) to the physical block 304(D+1) may become meaningless. Additionally, because data must be written orderly into the physical pages of the physical blocks, the memory management circuit 202 only moves valid data before the physical page to be written.

In the present exemplary embodiment, the operation of temporarily keeping this temporary relationship (i.e., a relationship between the physical block 304(0) and the physical block 304(D+1)) is referred to as opening mother-child blocks, and the original physical block is referred as a "mother physical block" and the substitute physical block is referred as a "child physical block".

Thereafter, the memory management circuit 202 will integrate the physical block 304(0) and the physical block 304 (D+1) into a single physical block when the contents of the two are to be actually combined, so that the efficiency of using physical blocks can be improved. Herein, the operation of integrating the physical blocks is also referred to as closing mother-child blocks. For example, as shown in FIG. 8, when closing the mother-child blocks, the memory management circuit 202 copies rest of the valid data in the physical block 304(0) (i.e., data stored in the $4^{th}$~$K^{th}$ physical addresses of the physical block 304(0)) to the $4^{th}$~$K^{th}$ physical addresses of the substitute physical block 304(D+1), and then erases the physical block 304(0) and associates the erased physical block 304(0) with the spare area 404. Meanwhile, the physical block 304(D+1) is associated with the data area 402. Namely, the memory management circuit 202 re-maps the logical block 510(0) to the physical block 304 (D+1) in the logical block-physical block mapping table. Additionally, in the present exemplary embodiment, the memory management circuit 202 establishes a spare area physical block table (not shown) for recording the physical blocks currently associated with the spare area 404. It should be noted that when opening mother-child blocks, the memory management circuit 202 needs more storage spaces of the buffer memory 252 to store management variables for recoding detail storage statuses. For example, these management variables record which physical pages of the physical blocks 304(0) and 304 (D+1) are used to store valid data of the logical block 510(0) (as shown in FIG. 7). Accordingly, during the operation of the non-volatile memory storage apparatus 100, the number of mother-child blocks is limited. Therefore, when the non-volatile memory storage apparatus 100 receives a write command from the host system 1000 and the number of opened mother-child blocks reaches the maximum, the memory management circuit 202 must close one of the opened mother-child blocks, so as to execute the write command. Herein, the writing operations shown in FIGS. 6~8 are referred to as "a general writing mode".

Figure 9:
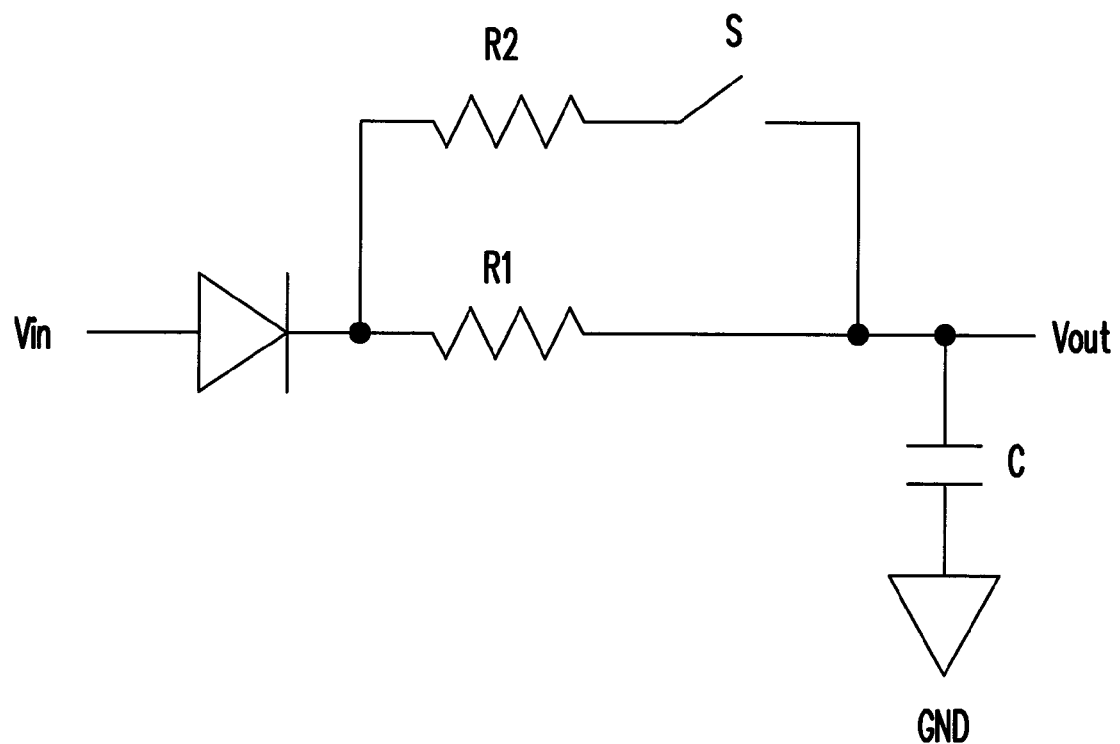
FIG. 9 is a schematic diagram illustrating an energy storage circuit according to an exemplary embodiment of the invention.

FIG. 9 is a schematic diagram illustrating an energy storage circuit according to an exemplary embodiment of the invention.

Referring FIG. 9, the energy circuit 1110 includes a diode D, a first resistance R1, a second resistance R2, a switch S and a capacitor set C. The anode of the diode D receives an input voltage Vin from the host system 1000 and the cathode of the diode D outputs an output voltage Vout. A first terminal of the first resistance R1 and a first terminal of the second resistance R2 are coupled to the cathode of the diode D. A first terminal of the switch is coupled to a second terminal of the second resistance R2 and a control terminal of the switch S is coupled to the memory controller 104. A first terminal of the capacitor set C is coupled to a second terminal of the switch and a second terminal of the capacitor set C is coupled to a ground terminal. In this exemplary embodiment, the capacitor set C may include a plurality of capacitors coupling with a parallel connection.

In the present exemplary embodiment, when the non-volatile memory apparatus 100 is coupled to the host system 1000, the capacitor set C stores a spare electric energy. The spare electric energy stored by the capacitor set C is used for temporarily keeping the operations of the memory controller 104 and the non-volatile memory module 106 when the input voltage supplied by the host system 1000 is not enough. In this exemplary embodiment, the capacity of the capacitor set C is 470 microfarads (uF)~2200 uF. It should be noted that in the present exemplary embodiment, the first resistance R1 is used for avoiding inrush currents due to the capacitor set C when the non-volatile memory apparatus 100 is coupled to the host system 1000. For example, the resistance value of the first resistance R1 is 200Ω. In particular, the first resistance R1 may cause the output voltage Vout to be lower, and therefore the memory controller 104 and the non-volatile memory module 106 may not operated normally. Accordingly, in the present exemplary embodiment, when the non-volatile memory apparatus 1000 first receives a small computer standard interface (SCSI) command from the host system 1000, the memory controller 104 (for example, the memory management circuit 202 of the memory controller 104) turns on the switch such that the switch S is closed to couple to the second resistance R2 in parallel and the output voltage Vout becomes larger. For example, the resistance value of the second resistance R1 is 1Ω. Accordingly, when the switch S is turned on, the memory controller 104 and the non-volatile memory module 106 will operate with a normal operation voltage according to the commands from the host system 1000.

It should be noted that in the present exemplary embodiment, the memory controller 104 (for example, the memory management circuit 202 of the memory controller 104) turns on the switch S after being enabled and first receiving a SCSI command from the host system. However, the invention is not limited thereto, and in another exemplary embodiment, the memory controller 104 (for example, the memory management circuit 202 of the memory controller 104) turns on the switch S after being enabled and first receiving a write command from the host system. Or, in another exemplary embodiment, the memory controller 104 (for example, the memory management circuit 202 of the memory controller 104) turns on the switch S after being enabled and waiting for a delay time. For example, the delay time is 3 seconds.

In the present exemplary embodiment, the memory controller 104 (for example, the memory management circuit 202 of the memory controller 104) detects a detection signal corresponding to the input voltage Vin. And, when the detection signal indicates the input voltage Vin is always smaller than a predetermined voltage (e.g., 4 volt (V)) for a predetermined period (e.g., 10 seconds), the memory controller 104 (for example, the memory management circuit 202 of the memory controller 104) starts a special writing mode to write data stored temporarily in the buffer memory 208 into the non-volatile memory module 106.

In particular, in the special writing mode, the memory controller 104 (for example, the memory management circuit 202 of the memory controller 104) gets one physical block from the spare area 404 and orderly writes data stored temporarily in the buffer memory 208 into the physical pages of the gotten physical block. To be specific, data stored temporarily in the buffer memory 208 is written into the gotten physical block starting from the $0^{th}$ physical page of the gotten physical block. That is, the memory controller 104 (for example, the memory management circuit 202 of the memory controller 104) does not write the data stored temporarily in the buffer memory 208 according to the corresponding logical access addresses (i.e., the general writing mode shown in FIGS. 6~8). Accordingly, the memory controller 104 (for example, the memory management circuit 202 of the memory controller 104) may spend less time to write the data stored temporarily in the buffer memory 208 into the non-volatile memory module 106.

In the special writing mode, the memory controller 104 (for example, the memory management circuit 202 of the memory controller 104) records a special mark in the redundant bit area of the physical pages of the gotten physical block, and thereby the physical block written with the special writing mode can be distinguished from other physical block written with the general writing mode. Additionally, the logical addresses corresponding to the data stored temporarily in the buffer memory 208 (i.e., mapping information) are recorded in the redundant bit area of the physical pages of the gotten physical block. Accordingly, when the non-volatile memory apparatus 1000 is re-started, the memory controller 104 (for example, the memory management circuit 202 of the memory controller 104) may move (i.e., re-write) correctly the data written with the special writing mode to the mapped physical blocks.

It should be noted that in the present exemplary embodiment, the memory controller 104 (for example, the memory management circuit 202 of the memory controller 104) records the special mark and the mapping information in the redundant bit area of the physical pages of the gotten physical block. However, the present invention is limited thereto, and in another exemplary embodiment, the memory controller 104 (for example, the memory management circuit 202 of the memory controller 104) may get another physical block from the spare area 404 as a special physical block for recording information relating to the physical phages used for writing data stored temporarily in the buffer memory 208 and mapping information corresponding to the data stored temporarily in the buffer memory 208. Then, when the non-volatile memory apparatus 1000 is re-started, the memory controller 104 (for example, the memory management circuit 202 of the memory controller 104) may read the mapping information from the special physical block and move correctly the data written with the special writing mode to the mapped physical blocks. It should be mentioned that the memory controller 104 (for example, the memory management circuit 202 of the memory controller 104) may pre-allocate some physical blocks for being the special physical blocks. For example, in an exemplary embodiment, the physical blocks 304-(D+1)~304-(D+10) are pre-allocated for being the special physical blocks. Accordingly, when the non-volatile memory apparatus 1000 is re-started, the memory controller 104 (for example, the memory management circuit 202 of the memory controller 104) may only confirm data stored in the physical blocks 304-(D+1)~304-(D+10) to identify whether data stored temporarily in the buffer memory 208 is written into the non-volatile memory module 106 when the non-volatile memory apparatus 100 was shut down previously, thereby determining whether the operation of moving data is needed to perform.

Additionally, in another exemplary embodiment, in the special writing mode, the memory controller 104 (for example, the memory management circuit 202 of the memory controller 104) may use only lower physical pages of the gotten physical block to write data stored temporarily in the buffer memory 208.

In detail, NAND flash memories may be classified, according to the number of bits that can be stored in each memory cell, into single level cell (SLC) NAND flash memory and MLC NAND flash memory. When programming memory cells of an SLC NAND flash memory, only single phase programming may be performed, so that each memory cell is capable of storing only one bit of data. The programming of the MLC NAND memory has several phases. For example, for a 4-level memory cell, programming of physical blocks may be divided into two phases. The first phase is the programming of a lower physical page, and the physical property of the programming of the lower physical page is similar to the physical property of the programming of the SLC NAND memory. The second phase is the programming of the upper physical page, wherein the programming speed (i.e., write speed) of the lower physical page is faster than the programming speed of the upper physical page. Therefore, physical pages of each physical block may be categorized into slow physical pages (i.e., upper physical pages) and fast physical pages (i.e., lower physical pages). Similarly, in an 8-level memory cell or a 16-level memory cell, each memory cell contains more physical pages and accordingly is programmed in more phases. Herein, the physical pages having the fastest programming speed are defined as the "fast physical pages", and all other pages having slower programming speed are defined as the "slower physical pages". For example, the "slower pages" may include a plurality of physical pages having different programming speeds. Additionally, in other cases, the "slower physical pages" may been defined as the physical pages having the slowest programming speed, or the physical pages having the slowest programming speed and some of the physical pages having faster programming speeds than the slowest programming speed. For example, in a 16-level memory cell, the fast physical pages are defined as the physical pages having the fastest and the second fastest programming speed, while the slow physical pages are defined as the physical pages having the slowest and the second slowest programming speed. In the present exemplary embodiment, the physical pages of physical blocks are categorized into upper physical pages and lower physical pages according to the programming property thereof.

Accordingly, the time needed for writing data stored temporarily in the buffer memory 208 can be further shortened by using only the lower physical pages of the gotten physical block.

Additionally, in the present exemplary embodiment, an access indicating light (not shown) is configured in the non-volatile memory apparatus 100 for indicating that access operations of the non-volatile memory apparatus 100 is performing. For example, the access indicating light is a light emitting diode (LED) light.

In particular, in another exemplary embodiment, in the special writing mode, the memory controller 104 (for example, the memory management circuit 202 of the memory controller 104) may turn off the access indicating light to reduce the power consumption.

It should be mentioned that in the present exemplary embodiment, when the detection signal indicates the input voltage Vin is always smaller than the predetermined voltage for the predetermined period, the memory controller 104 (for example, the memory management circuit 202 of the memory controller 104) starts the special writing mode. However, the present invention is not limited thereto, and in another exemplary embodiment, the memory controller 104 (for example, the memory management circuit 202 of the memory controller 104) starts the special writing mode based on a detection signal indicating the inactive status of the connector 102. To be specific, in a case where the connector 102 complies with the USB 3.0 standard, when a superspeed connection between the non-volatile memory storage apparatus 100 and the host system 1000 fails, the controller 104 (for example, the memory management circuit 202 of the memory controller 104) detects the inactive status (e.g., SS.Inactive status) of the connector 102, thereby identifying that the non-volatile memory apparatus 100 removed from the host system 1000. Additionally, in another exemplary embodiment, the memory controller 104 (for example, the memory management circuit 202 of the memory controller 104) starts the special writing mode based on a suspend mode signal, a warm reset signal or a hot reset signal from the host system 1000. Herein, the warm reset signal is used for re-starting the non-volatile memory apparatus 100 without decreasing the operation voltage, and the hot rest signal is used for making the non-volatile memory apparatus 100 to re-arrange data and re-start at a starting point.

Figure 10:
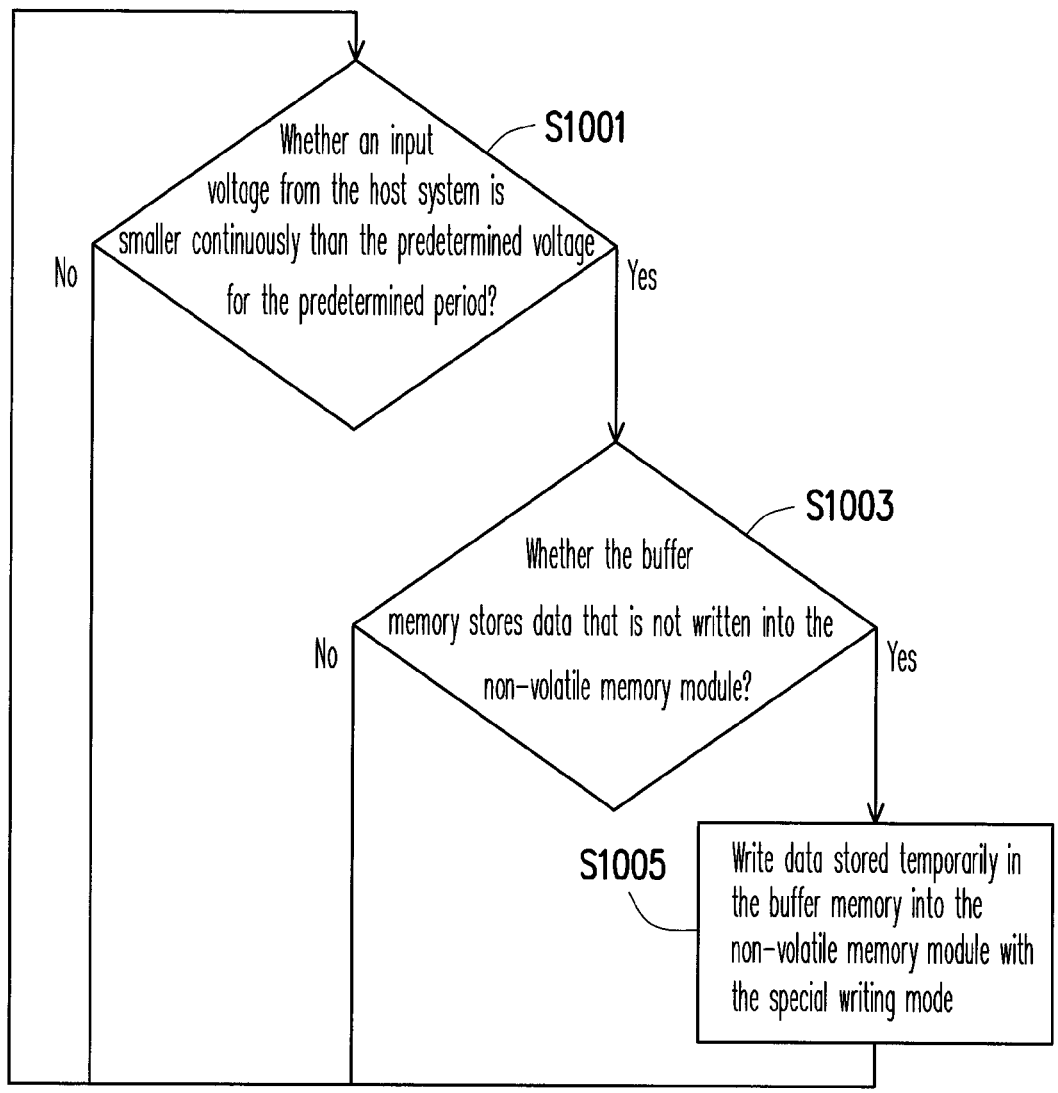
FIG. 10 is a flowchart illustrating the data storing method according to an exemplary embodiment of the present invention.

FIG. 10 is a flowchart illustrating the data storing method according to an exemplary embodiment of the present invention.

Referring to FIG. 10, during the operating of the non-volatile memory storage apparatus 100, in step S1001, whether an input voltage from the host system 1000 is smaller continuously than the predetermined voltage for the predetermined period is determined. To be specific, in step S1001, the memory controller 104 (for example, the memory management circuit 202 of the memory controller 104) continuously detects the input voltage from the host system 1000 to determine whether the input voltage from the host system 1000 is smaller continuously than the predetermined voltage for the predetermined period.

If the input voltage from the host system 1000 is smaller continuously than the predetermined voltage for the predetermined period, in step S1003, whether the buffer memory 208 stores data that is not written into the non-volatile memory module 106 is determined.

If the buffer memory 208 stores data that is not written into the non-volatile memory module 106, in step S1005, the data stored temporarily in the buffer memory 208 is written into the non-volatile memory module 106 with the special writing mode. If the input voltage from the host system 1000 is not smaller continuously than the predetermined voltage for the predetermined period or the buffer memory 208 does not store data that is not written into the non-volatile memory module 106, step S1001 is executed to continue to detect the input voltage from the host system 1000. In the present exemplary embodiment, the process shown in FIG. 10 is continuously performed after the non-volatile memory apparatus 100 is enabled until the non-volatile memory apparatus 100 is shut down.

Figure 11:
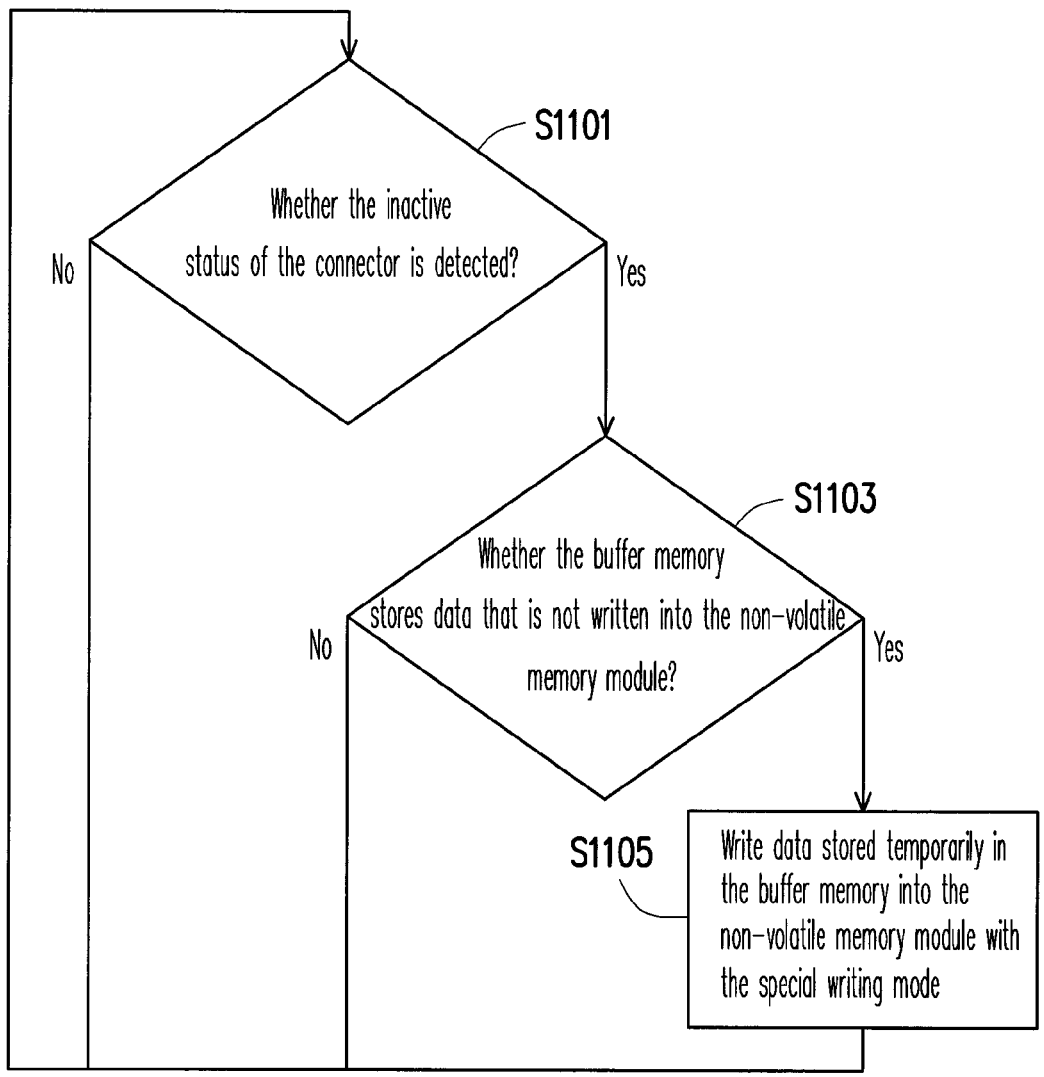
FIG. 11 is a flowchart illustrating the data storing method according to another exemplary embodiment of the present invention.

FIG. 11 is a flowchart illustrating the data storing method according to another exemplary embodiment of the present invention.

Referring to FIG. 11, during the operating of the non-volatile memory storage apparatus 100, in step S1101, whether the inactive status of the connector 102 is detected is determined. To be specific, in step S1101, the memory controller 104 (for example, the memory management circuit 202 of the memory controller 104) determines whether the inactive status of the connector 102 is detected.

If the inactive status of the connector 102 is detected, in step S1103, whether the buffer memory 208 stores data that is not written into the non-volatile memory module 106 is determined.

If the buffer memory 208 stores data that is not written into the non-volatile memory module 106, in step S1105, the data stored temporarily in the buffer memory 208 is written into the non-volatile memory module 106 with the special writing mode.

If the inactive status of the connector 102 is not detected or the buffer memory 208 does not store data that is not written into the non-volatile memory module 106, step S1101 is executed to continue to detect the inactive status of the connector 102. Similarly, the process shown in FIG. 11 is continuously performed after the non-volatile memory apparatus 100 is enabled until the non-volatile memory apparatus 100 is shut down.

Figure 12:
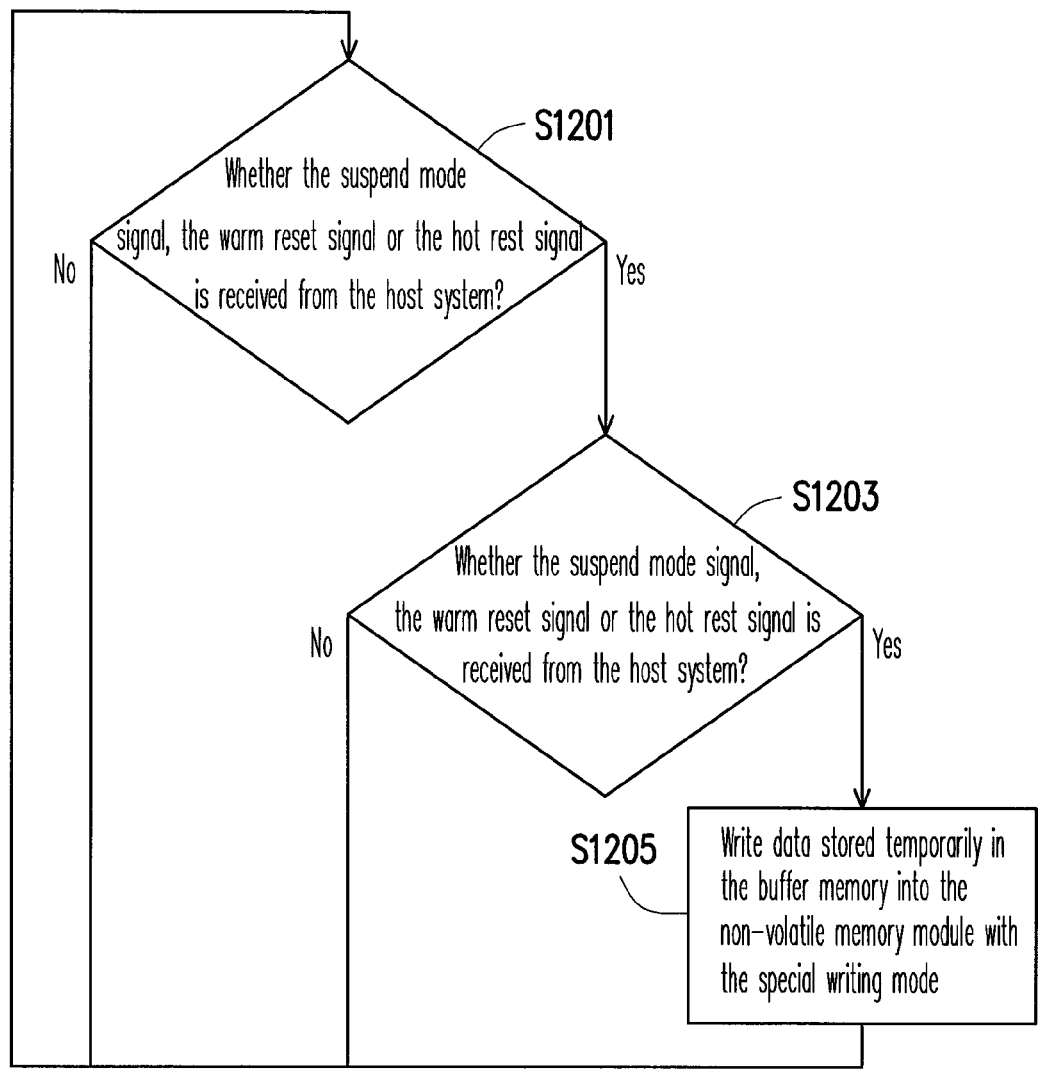
FIG. 12 is a flowchart illustrating the data storing method according to another exemplary embodiment of the present invention.

FIG. 12 is a flowchart illustrating the data storing method according to another exemplary embodiment of the present invention.

Referring to FIG. 12, during the operating of the non-volatile memory storage apparatus 100, in step S1201, whether the suspend mode signal, the warm reset signal or the hot rest signal is received from the host system 1000 is determined. To be specific, in step S1201, the memory controller 104 (for example, the memory management circuit 202 of the memory controller 104) determines whether the suspend mode signal, the warm reset signal or the hot rest signal is received from the host system 1000.

If the suspend mode signal, the warm reset signal or the hot rest signal is received from the host system 1000, in step S1203, whether the buffer memory 208 stores data that is not written into the non-volatile memory module 106 is determined If the buffer memory 208 stores data that is not written into the non-volatile memory module 106, in step S1205, the data stored temporarily in the buffer memory 208 is written into the non-volatile memory module 106 with the special writing mode.

If the suspend mode signal, the warm reset signal or the hot rest signal is not received from the host system 1000 or the buffer memory 208 does not store data that is not written into the non-volatile memory module 106, step S1201 is executed to continue to determine whether the suspend mode signal, the warm reset signal or the hot rest signal is received from the host system 1000. Similarly, the process shown in FIG. 12 is continuously performed after the non-volatile memory apparatus 100 is enabled until the non-volatile memory apparatus 100 is shut down.

As described above, the non-volatile memory storage apparatus, the memory controller and the data storing method of the exemplary embodiments of the present invention are capable of preventing data stored temporarily in the buffer memory 208 from losing due to power failure. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A memory controller, comprising:
   a host interface, configured to couple to a host system;
   a memory interface, configured to couple to a non-volatile memory module, wherein the non-volatile memory module includes a plurality of physical blocks and the physical block is grouped into at least a data area and a spare area;
   a memory management circuit, coupled to the host interface and the memory interface; and
   a buffer memory, coupled to the memory management circuit and configured to temporarily store data from the host system;
   wherein the memory management circuit is configured to get a physical block from the spare area and write the data stored temporarily in the buffer memory into the gotten physical block after receiving a signal,
   wherein the signal is a detection signal indicating that the input voltage is smaller continuously than a predetermined voltage for a predetermined period, a detection signal indicating that an inactive status of the connector, or a suspend mode signal, a warm reset signal or a hot-reset signal from the host system.

2. The memory controller according to claim 1, wherein the memory management circuit is further configured to be coupled to an energy storage circuit, and the energy storage circuit includes:
   a diode, having an anode and a cathode, wherein the anode is configured to receive an input voltage and the cathode is configured to provide an output voltage;
   a first resistance and a second resistance, wherein a first terminal of the first resistance is coupled to the cathode of the diode and a first terminal of the second resistance is coupled to the cathode of the diode;
   a switch, wherein a first terminal of the switch is coupled to a second terminal of the second resistance and a control terminal of the switch is coupled to the memory controller; and
   a capacitor set, wherein a first terminal of the capacitor set is coupled to a second terminal of the first resistance and a second terminal of the switch and a second terminal of the capacitor set is coupled to a ground terminal.

3. The memory controller according to claim 2, wherein the memory management circuit is further configured to turn on the switch after the memory controller first receives a small computer standard interface command from the host system after the memory controller is enabled, the memory controller first receives a write command from the host system after the memory controller is enabled, or the memory controller is enabled and waits for a delay time.

4. A data storing method for a non-volatile memory module, the data storing method comprising:
   determining whether an inactive status of a connector is detected by a memory controller; and
   writing data stored temporarily in a buffer memory into the non-volatile memory module by the memory controller after the inactive status of the connector is detected,
   wherein the non-volatile memory module includes a plurality of physical blocks and the physical block is grouped into at least a data area and a spare area,
   wherein the step of writing the data temporarily stored in the buffer memory into the non-volatile memory module comprises:
   getting a physical block from the spare area and writing the data temporarily stored in the buffer memory into the gotten physical block by the memory controller.

5. The data storing method according to claim 4, further comprising:
   turning on a switch of an energy storage circuit by the memory controller after first receiving a small computer standard interface command from the host system.

6. The data storing method according to claim 4, further comprising:
   turning on a switch of an energy storage circuit by the memory controller after first receiving a write command from the host system.

7. The data storing method according to claim 4, further comprising:
   turning on a switch of an energy storage circuit by the memory controller after the memory controller is enabled and waits for a delay time.

8. The data storing method according to claim 1, wherein the step of writing the data temporarily stored in the buffer memory into the gotten physical block comprises:
   using only at least one physical page belongs to a lower physical page among a plurality of physical pages of the gotten physical block to write the data stored temporarily in the buffer memory by the memory controller.

9. The data storing method according to claim 1, wherein the step of writing the data temporarily stored in the buffer memory into the non-volatile memory module further comprises:
   recording a mapping information corresponding to the data in a redundant bit area of the gotten physical block by the memory controller.

10. The data storing method according to claim 1, wherein the step of writing the data temporarily stored in the buffer memory into the non-volatile memory module further comprises:
    getting another physical block from the spare area and recording a mapping information corresponding to the data in the another physical block by the memory controller.

* * * * *